United States Patent
Santiquet et al.

(10) Patent No.: US 10,474,763 B2
(45) Date of Patent: Nov. 12, 2019

(54) COMPUTER-IMPLEMENTED METHOD FOR DEFINING INITIAL CONDITIONS FOR DYNAMIC SIMULATION OF AN ASSEMBLY OF OBJECTS IN A THREE-DIMENSIONAL SCENE OF A SYSTEM OF COMPUTER-AIDED DESIGN

(71) Applicant: Dassault Systemes, Velizy Villacoublay (FR)

(72) Inventors: Laurent Santiquet, Bouc-Bel-Air (FR); Bertrand Faure, Meudon la Foret (FR)

(73) Assignee: DASSAULT SYSTEMS, Velizy Villacoublay (FR)

( * ) Notice: Subject to any disclaimer, the term of this patent is extended or adjusted under 35 U.S.C. 154(b) by 317 days.

(21) Appl. No.: 13/905,009

(22) Filed: May 29, 2013

(65) Prior Publication Data

US 2013/0332118 A1    Dec. 12, 2013

(30) Foreign Application Priority Data

Jun. 7, 2012    (EP) .................................... 12305655

(51) Int. Cl.
  *G06F 17/50*    (2006.01)
  *G06T 19/20*    (2011.01)
  *G06F 3/0484*    (2013.01)

(52) U.S. Cl.
  CPC .......... *G06F 17/50* (2013.01); *G06F 3/04847* (2013.01); *G06F 17/5009* (2013.01); *G06T 19/20* (2013.01); *G06T 2219/2016* (2013.01)

(58) Field of Classification Search
  None
  See application file for complete search history.

(56) References Cited

U.S. PATENT DOCUMENTS 6,061,062 A    5/2000   Venolia
6,556,783 B1 *  4/2003   Gelphman ..................... 396/20
(Continued)

FOREIGN PATENT DOCUMENTS

JP    09-190467    7/1997
JP    2001-056872  2/2001
JP    2001-222572  8/2001

OTHER PUBLICATIONS

Anonymous "IBM Lotus Notes 8.5—Repeat Options", IBM Lotus Domino and Notes Information Center (Oct. 5, 2009). XP002690641 [Retrieved on Apr. 12, 2012]. Retrieved from Internet URL:http://publib.boulder.ibm.com/infocenter/domhelp/v8r0/index.jsp?topic+%2Fcom.ibm.notes85.help.doc@2Fcal_repeat_options_r.html.

(Continued)

*Primary Examiner* — Rehana Perveen
*Assistant Examiner* — Nithya J. Moll
(74) *Attorney, Agent, or Firm* — Hamilton, Brook, Smith & Reynolds, P.C.

(57) ABSTRACT

A computer-aided design system and computer-implemented method define initial conditions for dynamic simulation of an assembly of objects in a three-dimensional scene of a computer-aided design. The system and method provide (S1) the assembly of objects with information relative to kinematic joints linking objects of the assembly. The system/method provide (S2) a manipulating tool (M) embedded in the scene; attach (S3) said manipulating tool (M) to one object of the assembly; select (S4) a degree of freedom of the manipulating tool (M) attached to the object of the assembly; and input (S5) at least one initial condition (IC) according to said selected degree of freedom, an initial condition comprising an initial position and/or an initial speed and/or an initial acceleration. The tool has a referential (reference) with three-axes allowing for each axis a degree of freedom in translation and a degree of freedom in (Continued)

rotation. Next the system and method calculate (S6) and display in real time the dynamic simulation taking into account the initial conditions (IC) previously defined.

16 Claims, 13 Drawing Sheets

(56) References Cited

U.S. PATENT DOCUMENTS

| | | | |
|---|---|---|---|
| 6,597,382 B1 | 7/2003 | Charles et al. | |
| 6,963,824 B1 * | 11/2005 | Davidson et al. | 703/2 |
| 7,823,085 B2 | 10/2010 | Charles et al. | |
| 8,554,521 B2 * | 10/2013 | Diguet et al. | 703/1 |
| 2002/0123812 A1 * | 9/2002 | Jayaram et al. | 700/98 |
| 2008/0243456 A1 | 10/2008 | Hudetz et al. | |
| 2009/0248369 A1 * | 10/2009 | Debono et al. | 703/1 |

OTHER PUBLICATIONS

European Search Report dated Jan. 30, 2013 for European Application No. 12305655.8 filed Jun. 7, 2012.
Lotus Notes 8.5.1 screenshot—an example, XP 002688508. (Copy as of Dec. 4, 2012).

* cited by examiner

COMPUTER-IMPLEMENTED METHOD FOR DEFINING INITIAL CONDITIONS FOR DYNAMIC SIMULATION OF AN ASSEMBLY OF OBJECTS IN A THREE-DIMENSIONAL SCENE OF A SYSTEM OF COMPUTER-AIDED DESIGN

RELATED APPLICATION(S)

This application claims priority under 35 U.S.C. § 119 or 365 to European Application No. 12305655.8, filed Jun. 7, 2012. The entire teachings of the above application(s) are incorporated herein by reference.

FIELD OF THE INVENTION

The invention relates to the field of computers programs and systems, and more specifically to the field of designing of an assembly of object in a Computer-Aided Design application.

BACKGROUND OF THE INVENTION

Computer-aided techniques are known to include Computer-Aided Design or CAD, which relates to software solutions for authoring product design. Similarly, CAE is an acronym for Computer-Aided Engineering, e.g. it relates to software solutions for simulating the physical behavior of a future product. CAM stands for Computer-Aided Manufacturing and typically includes software solutions for defining manufacturing processes and operations.

A number of systems and programs are offered on the market for the design of objects (or parts) or assemblies of objects, forming a product, such as the one provided by Dassault Systèmes under the trademark CATIA. These CAD systems allow a user to construct and manipulate complex three dimensional or 3D models of objects or assemblies of objects. CAD systems thus provide a representation of modeled objects using edges or lines, in certain cases with faces. Lines or edges may be represented in various manners, e.g. non-uniform rational B-splines (NURBS). These CAD systems manage parts or assemblies of parts as modeled objects, which are mostly specifications of geometry. Specifically, CAD files contain specifications, from which geometry is generated, which in turn allow for a representation to be generated. Geometry and representation may be stored in a single CAD file or multiple ones. CAD systems include graphic tools for representing the modeled objects to the designers; these tools are dedicated to the display of complex objects; the typical size of a file representing an object in a CAD system being in the magnitude of one Megabyte per part, and an assembly may comprise thousands of parts. A CAD system manages models of objects, which are stored in electronic files.

In computer-aided techniques, the graphical user interface GUI plays an important role as regards the efficiency of the technique. Most of the operations required for manipulating and/or navigating the modeled objects may be performed by the user (e.g. the designers) on the GUI. Especially, the user may create, modify, and delete the modeled objects forming the product, and also explore the product so as to comprehend how modeled objects are interrelated, e.g. via a product structure. Traditionally, these operations are carried out through dedicated menus and icons which are located on the sides of the GUI. Recently, CAD systems such as CATIA allow calling these operations nearby the representation of the product. The designer does not need anymore to move the mouse towards menus and icons. Operations are thus available within reach of the mouse. In addition, the operations behave semantically: for a given operation selected by the designer, the CAD system may suggest to the designer, still nearby the mouse, a set of new operations according to the former selected operation that the designer is likely to select.

Until recent years, some computer software used, for example in automotive and aerospace industry, are based on geometry, for mechanical engineers to be able to see their work in space or in a three-dimensional displaying.

In this domain, computer softwares like CATIA, allow design geometry in a three dimension space. Such menu and toolbars contain a set of user-selectable icons, each icon being associated with one or more operations or functions. Some of these icons are associated with software tools, adapted for editing and/or working on a 3D geometrical modeled product or parts of product such as that displayed in the graphical user interfaces GUI. In the following description, terms "product", "part", "assembly" and the like may be referred to as "part" for the sake of simplicity. The concept of "part" can also be generalized to that of "object". An object encompasses any constituent of the final digital mock-up, for instance, considering an assembly, an object of this assembly can be a sub-assembly, a part, a kinematic joint, a material, the embedded software executed on an Electronic Control Unit (ECU), or any object needed to describe the entire environment of the assembly, like the modeling of the atmosphere in the case you want to study an airplane flying capacities.

It is known, in dynamic simulations, a user interface can set initial conditions with a panel wherein values must be entered numerically, for example in computer softwares like dymola, as illustrated on FIG. 1.

Setting initial conditions by numerical inputs is a pain, because, in this case, it is necessary to enter three arguments in a vector for an initial speed of rotation for example. Such a task is long and tedious. A mistake can easily be done and correction requires attention.

When the user enters an initial condition related to a rotation, for example a position (angle), rotation speed or acceleration, it is necessary to define numerical inputs in an oriented system. To describe such a rotation, the system commonly used are based on yaw, pitch and roll angles, Euler angles, or Euler angles in a different order. Such a mathematical sophistication is quite complex.

SUMMARY OF THE INVENTION

A goal of the invention is to provide a computer-implemented method and a system for dynamic simulation of an assembly of objects in a three-dimensional scene of a system of computer-aided design, taking into account one or several initial conditions, in an easy manner.

It is proposed, according to one aspect of the invention, a computer-implemented method for defining initial conditions for dynamic simulation of an assembly of objects in a three-dimensional scene of a system of computer-aided design, the method comprising the steps of:
  providing the assembly of objects with information relative to kinematic joints linking objects of the assembly;
  providing a manipulating tool embedded in the scene, comprising a referential with three-axis allowing for each axis a degree of freedom in translation and a degree of freedom in rotation;
  attaching said manipulating tool to one object of the assembly;

selecting a degree of freedom of the manipulating tool attached to the object of the assembly;

inputting at least one initial condition according to said selected degree of freedom, an initial condition comprising an initial position and/or an initial speed and/or an initial acceleration; and calculating and displaying in real time the dynamic simulation taking into account the initial conditions previously defined.

In other words an initial condition comprises a position to be applied, and/or a speed and/or an acceleration to be initially applied.

Thus, such a computer-implemented method allows a user to easily enter initial conditions.

According to an embodiment the step of inputting at least one initial condition comprises:

a first sub-step of selecting a magnitude or range of values of an initial condition; and a second sub-step of determining a value of an initial condition among said magnitude.

Thus it is easy for the user to directly determine the value of an initial condition to the assembly of objects.

According to an embodiment, the step of inputting at least one initial condition is executed by performing a movement of the manipulating tool the movement being converted into an initial condition.

Thus, the user can enter initial conditions with a mouse like he would do with a joystick in a video game for example.

Performing a movement of the manipulating tool is made with a mouse with a pressed button or with a contact of a finger on a screen of displaying.

Thus it is very easy for the user to enter one or several initial conditions.

Alternatively, the step of inputting at least one initial condition is executed by directly typing a value of the initial condition.

It is proposed, according to another aspect of the invention, a computer-readable medium having computer-executable instructions to cause the computer system to perform the method for defining initial conditions for dynamic simulation of an assembly of objects in a three-dimensional scene of a system of computer-aided design as described above.

It is proposed, according to another aspect of the invention, a computer program product, stored on a computer readable medium, for defining initial conditions for dynamic simulation of an assembly of objects in a three-dimensional scene of a system of computer-aided design, comprising code means for causing the system to take the steps as described above.

It is proposed, according to another aspect of the invention, an apparatus for defining initial conditions for defining initial conditions (IC) for dynamically manipulating an assembly of objects in a three-dimensional scene of a system of computer-aided design comprising means for implementing the steps of the method as described above.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

The invention will be better understood with the study of some embodiments described by way of non-limiting examples and illustrated by the accompanying drawings wherein.

DETAILED DESCRIPTION OF THE INVENTION

A description of example embodiments of the invention follows.

The teachings of all patents, published applications and references cited herein are incorporated by reference in their entirety.

The steps of the present method can be performed by one or more programmable processors executing a computer program to perform functions of the invention by operating on input data and generating output.

A computer program can be written in any form of programming language, including compiled or interpreted languages, and the computer program can be deployed in any form, including as a stand-alone program or as a subroutine, element or other unit suitable for use in a computing environment. A computer program can be deployed to be executed on one computer or on multiple computers at one site or distributed across multiple sites and interconnected by a communication network.

Following figures explain more in details the functioning of the present invention.

Figure 1:
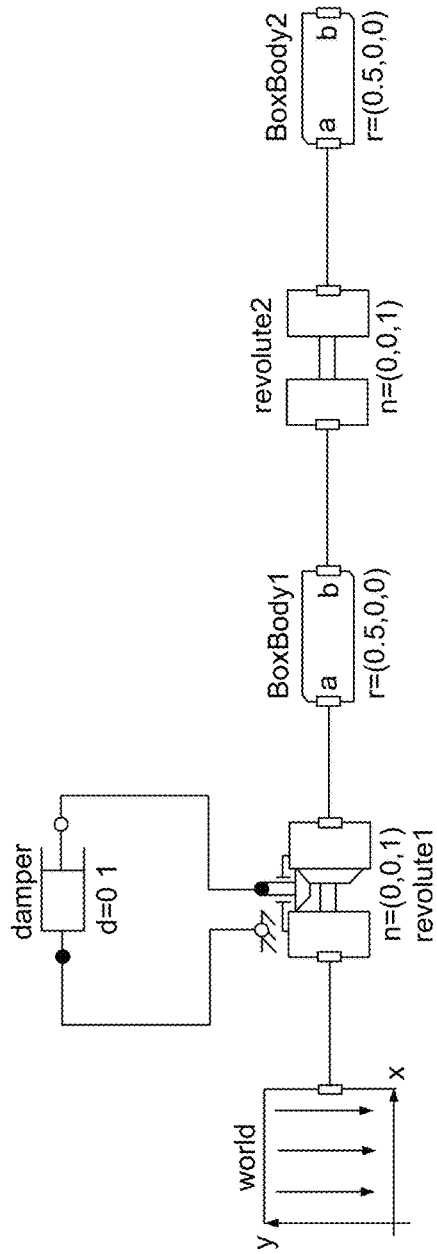
FIG. 1 illustrates an example of entering initial conditions of a system of computer-aided design, in a basic use case, according to background art.
Figure 2:
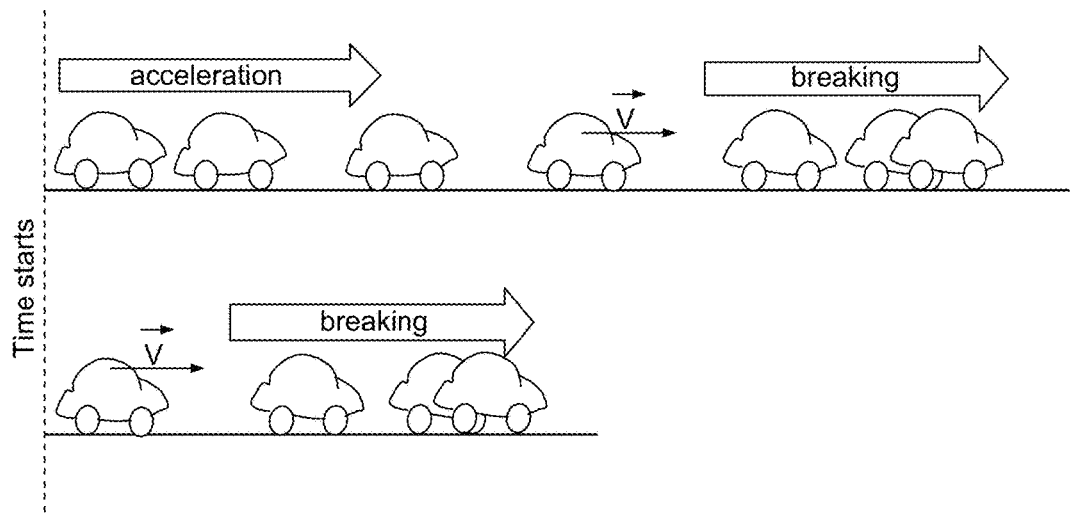
FIG. 2 illustrates the necessity to be able to input initial conditions in simulation.

FIG. 2 illustrates the necessity to be able to input initial conditions IC in simulation.

On the top of FIG. 2 is represented a simulation of a car, made with a known computer-implemented method. A first phase of acceleration of the car until reaching a desired speed $\vec{V}$, before simulating a breaking phase.

On the bottom of FIG. 2 is represented a similar simulation realized with a computer-implemented method according to an aspect of the invention, wherein the simulation directly starts with the car having the speed $\vec{V}$ entered as an initial condition IC.

In simulation, an initial condition IC allows to focus directly on one phase of the motion (in this example the breaking phase) skipping the uninteresting phase leading to it, in this example the acceleration phase.

When a plurality of initial conditions are entered, if some are not compatible, the solver respects the most possible physics law rules.

This invention allows helping the definition of initial conditions directly on three dimensional parts of an assembly of objects without manual numerical input of vector arguments.

Figure 3:
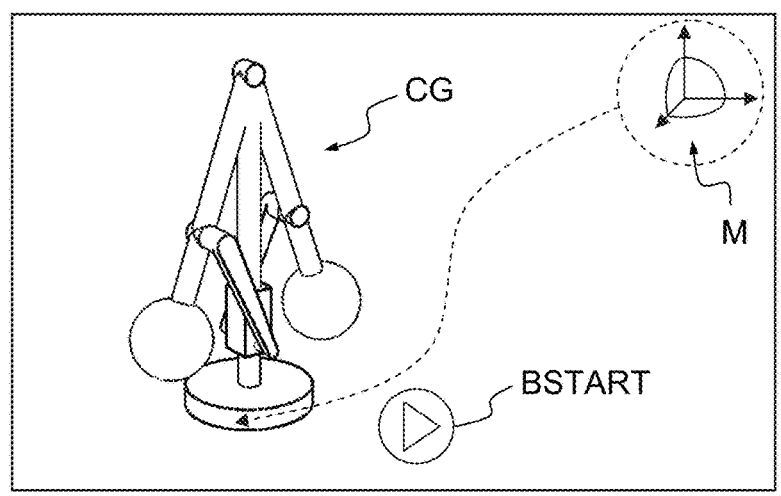
FIGS. 3 to 9 illustrate an example of defining initial conditions for dynamic simulation of an assembly of objects in a three-dimensional scene of a system of computer-aided design, according to an aspect of the invention.

On FIGS. 3 to 9 are illustrated an example of defining initial conditions for dynamic simulation of an assembly of objects in a three-dimensional scene of a system of computer-aided design, according to an aspect of the invention On FIG. 3, the method starts with a 3D or three dimensional model or assembly of objects stopped or motionless. On this example the assembly of objects or 3D model is a centrifugal "fly ball" governor CG whose rotation of the mast would spread apart the two spheres of the assembly until the equilibrium, as defined by Newton's dynamic fundamental law, is reached.

At the beginning, a dynamic simulation is ready to be started with a displayed button BSTART as illustrated on FIG. 3. During step 1, like in known systems, the usual way of interaction is a 3D manipulator M, able of changing 3D positions of parts of the assembly.

A manipulator is a graphical artifact controllable by a mouse (cf U.S. Pat. No. 7,823,085) or with a finger on a touch screen. It's positioned on a part and suggests different ways of manipulation. The manipulator M is composed of an axis system with three orthogonal axes and three arcs of circle offering different direction of manipulation: three translations along each of the three axis directions, and three rotations along the three arcs or, in other words, around the three axis. In brief, the manipulator M comprises and offers six degrees of freedom.

An interaction on an axis would translate the part on which the manipulator is placed, and an interaction on an arc would turn the part on which the manipulator is placed. This manipulator can turn and translate the part of the assembly on which it is placed: it's a position manipulator.

To express his intention to set an initial condition IC, the user will drag and drop the manipulator M on the part of the 3D assembly on which he wants to set an initial condition IC before pressing the start button BSTART to start dynamic simulation. The system will understand the user intent and start the simulation in a suspended state (at time=0 second) in which the user will input an initial condition IC before pressing the start button BSTART again and finally simulation will play taking into account IC.

Figure 4:
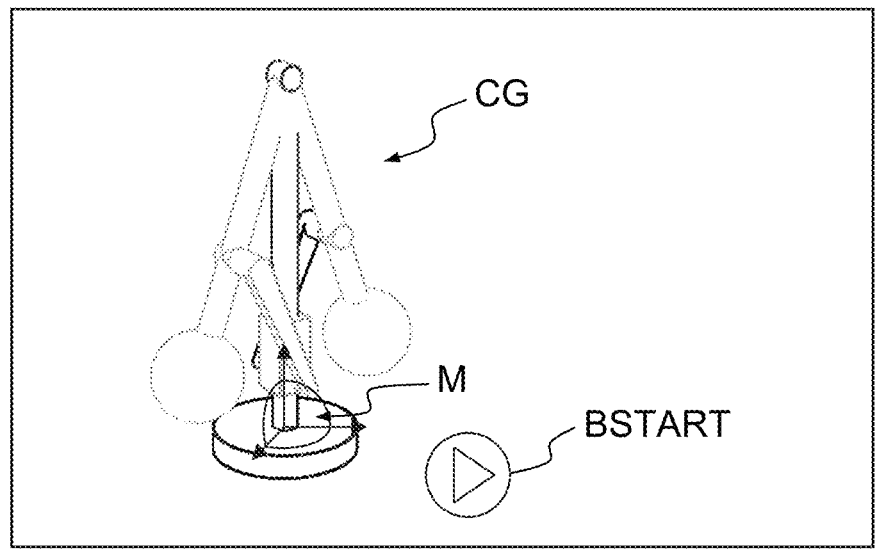

Thus in a step 1, like illustrated on FIG. 4, the user can make a drag and drop of the manipulator M on the part of the assembly where he wants to apply an initial condition IC.

Figure 5:
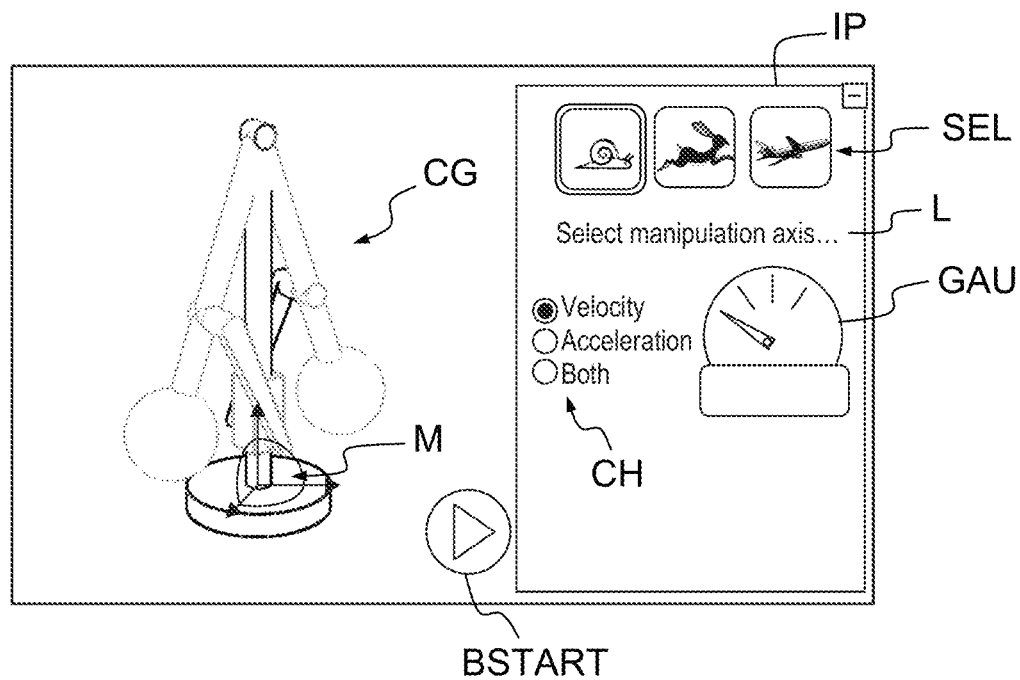

Then in a step 2 user presses the start button BSTART and result is represented on FIG. 5, wherein the manipulator M shows that manipulation is expected, for example the manipulator M can be blinking The simulation doesn't start yet, the model CG doesn't move. The system expects the user to set initial condition on the part with the manipulator M. The system is still in suspended state.

An initial panel IP is displayed, for example, on the right. The initial panel IP comprises a selector SEL of magnitude of the initial condition IC, for example with three icons, each representative of a magnitude of speed or acceleration. In the present example, three icons are represented, a first icon with a snail, representative of 0.1 to 1 m/s for translation speed, 0.1 to 1 m/s² for translation acceleration, 0.1 to 1 rad/s for rotation speed, 0.1 to 1 rad/s² for rotation acceleration a second icon with a hare, representative of 1 to 10 m/s for translation speed, 1 to 10 m/s² for translation acceleration, 1 to 10 rad/s for rotation speed, 1 to 10 rad/s² for rotation acceleration, and a third icon with a plane, representative of 10 to 100 m/s for translation speed, 10 to 100 m/s² for translation acceleration, 10 to 100 rad/s for rotation speed, 10 to 100 rad/s² for rotation acceleration.

The initial panel IP comprises a line L indicating that the user has to select a manipulation axis, and a gauge GAU to monitor the value of the initial condition IC. Furthermore, the initial panel IP comprises a choice of an initial condition IC as a velocity, an acceleration or both. In a step 3, the user selects an arc of the manipulator M with the mouse MOU or the finger in case of touch screen.

Figure 6:
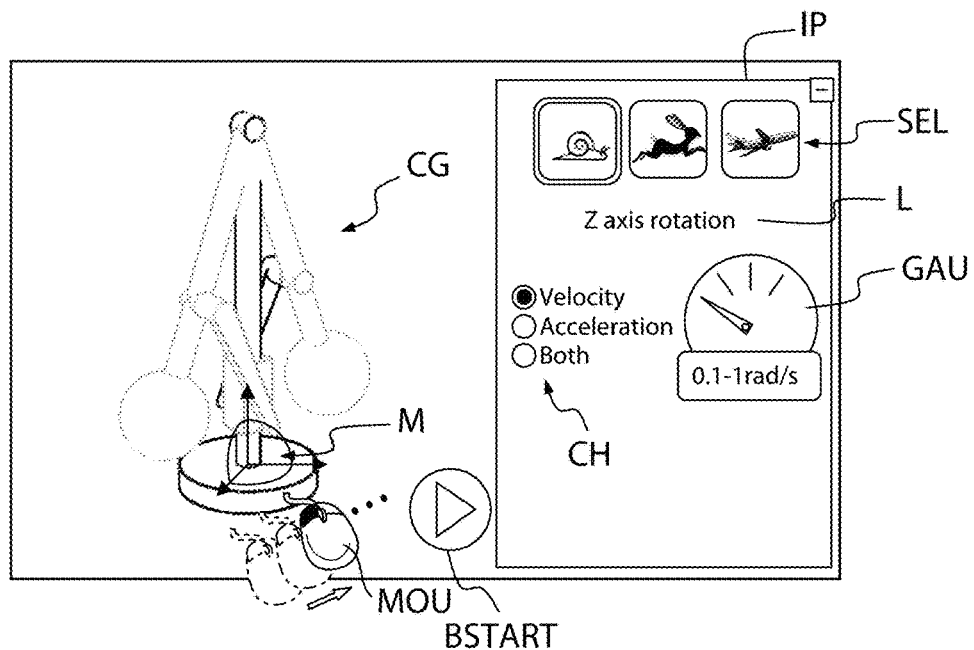

Like represented on FIG. 6, the user selects SEL the first icon (snail) corresponding to the first magnitude of values and chooses a degree of freedom, as indicated on the line L, the z axis rotation. In this case the z axis corresponding to the vertical axis. The user chooses to apply an initial condition IC as a velocity as indicated on the choice CH.

Figure 7:
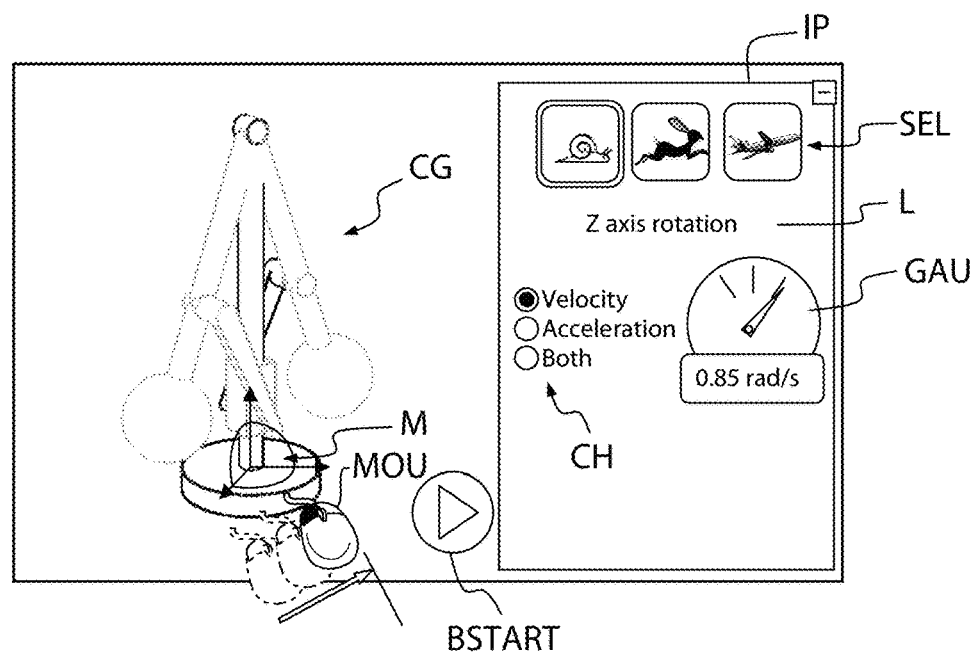

The displayed result is represented on FIG. 7, wherein the gauge GAU indicates the instantly measured value of the initial condition IC in real time. In a step 5, the user stop applying a speed.

Figure 8:
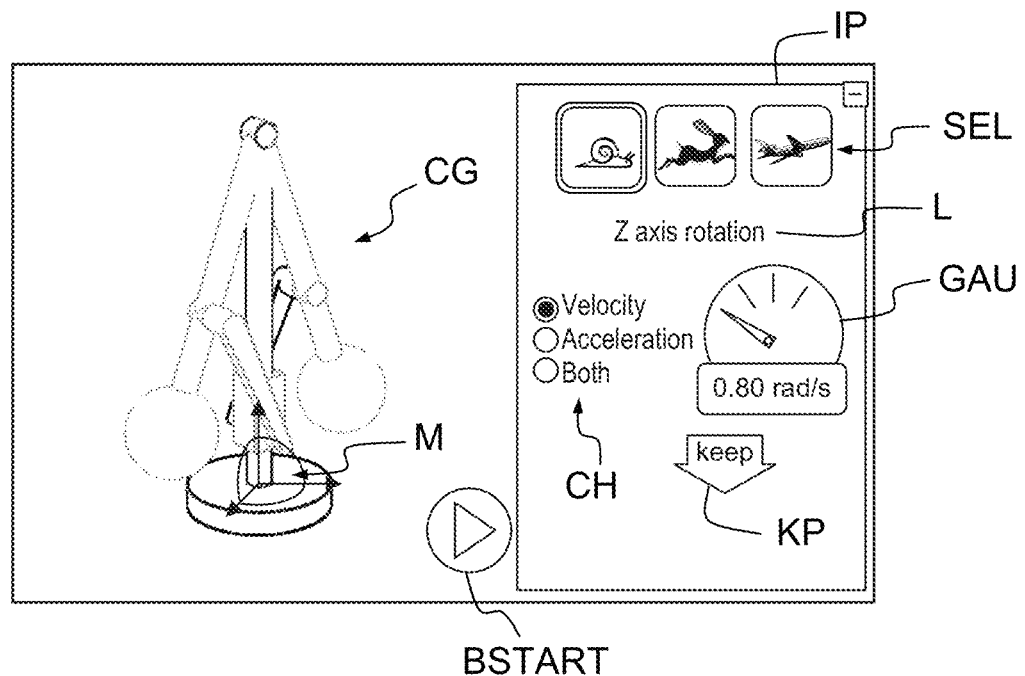

On FIG. 8, in result, the arrow of the gauge GAU indicates 0, as there is no more manipulation, and the value displayed on the bottom of the gauge GAU is the average value computed during the manipulation sequence. An indicator, in this case, an arrow KP comprising the word "keep", appears in back of the initial panel IP, to indicate to the user that he can keep the initial condition IC he has defined, and then define another one, by selecting another axis of manipulation of the manipulator M, and optionally putting the manipulator on another part. In this case, in a step 6, a value of 0.8 is overwritten on the value 0.85, the value 0.8 being the average value computed during the manipulation sequence.

Then, the user presses the start button BSTART to finally start the simulation taking into account the input initial condition IC.

Figure 9:
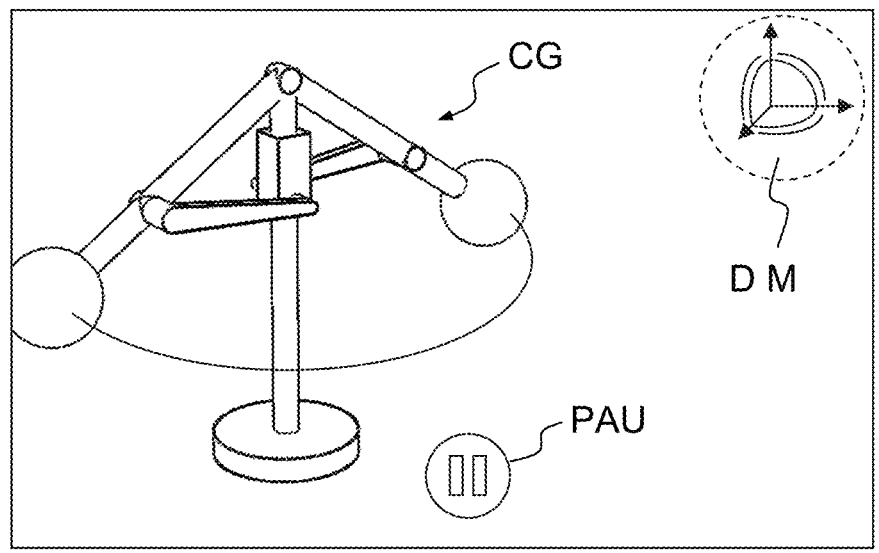

In result, like represented on FIG. 9, the simulation starts and runs. The simulation can be paused, by pressing the pause button PAU. The model CG is in motion, and the rotation speed at the beginning of the simulation is 0.8 rad/s, the value fixed in the initial condition IC. In this case, a dynamic manipulator DM appears which can be used to interact with the model CG during the simulation.

On FIGS. 10 to 21 is illustrated a step by step scenario showing how the user can input several initial conditions.

Figure 10:
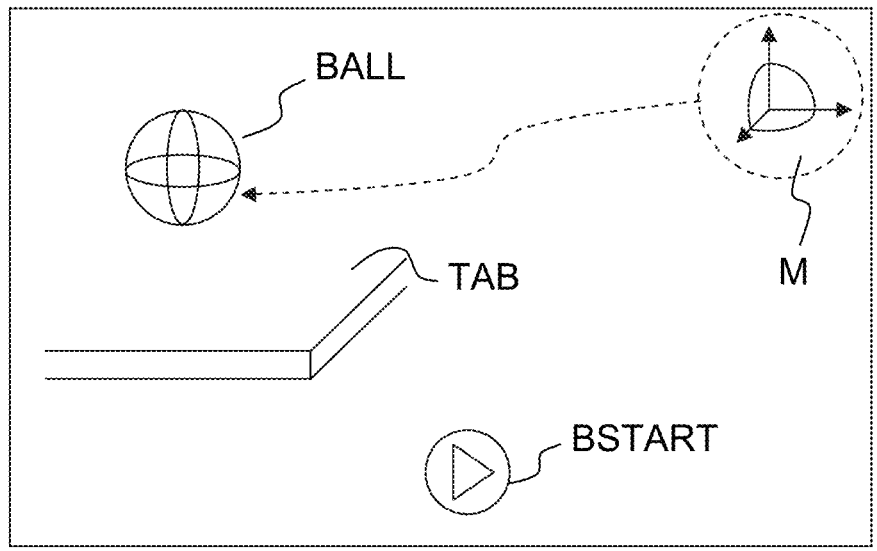
FIGS. 10 to 21 illustrate a step by step scenario showing how the user can input several initial conditions, according to an aspect of the invention.
Figure 11:
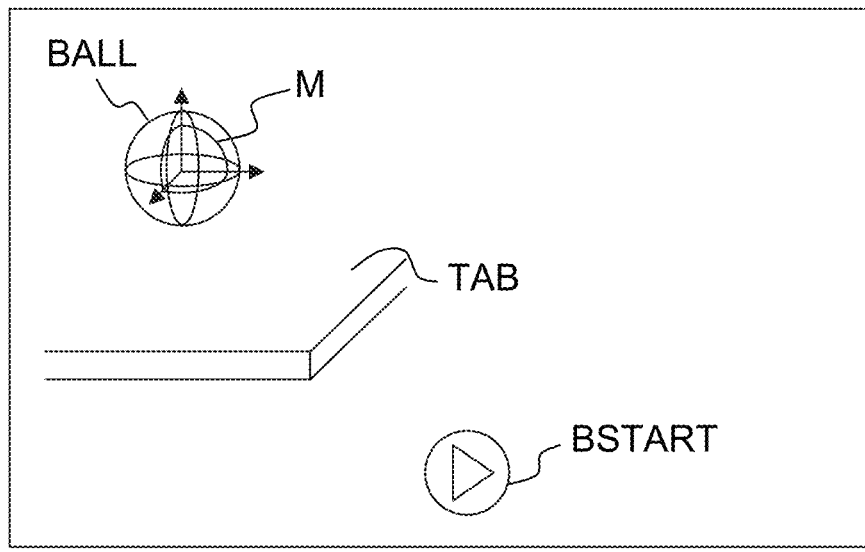

On FIG. 10, the method starts with a 3D or three dimensional model or assembly of objects stopped or motionless. On this example the assembly of objects or 3D model is a ball BALL on a table TAB.

In a step 1, the user can make a drag and drop of the manipulator M on the part, in this case the ball BALL of the assembly, where the user wants to apply an initial condition IC. The result of this operation is displayed on FIG. 11.

Figure 12:
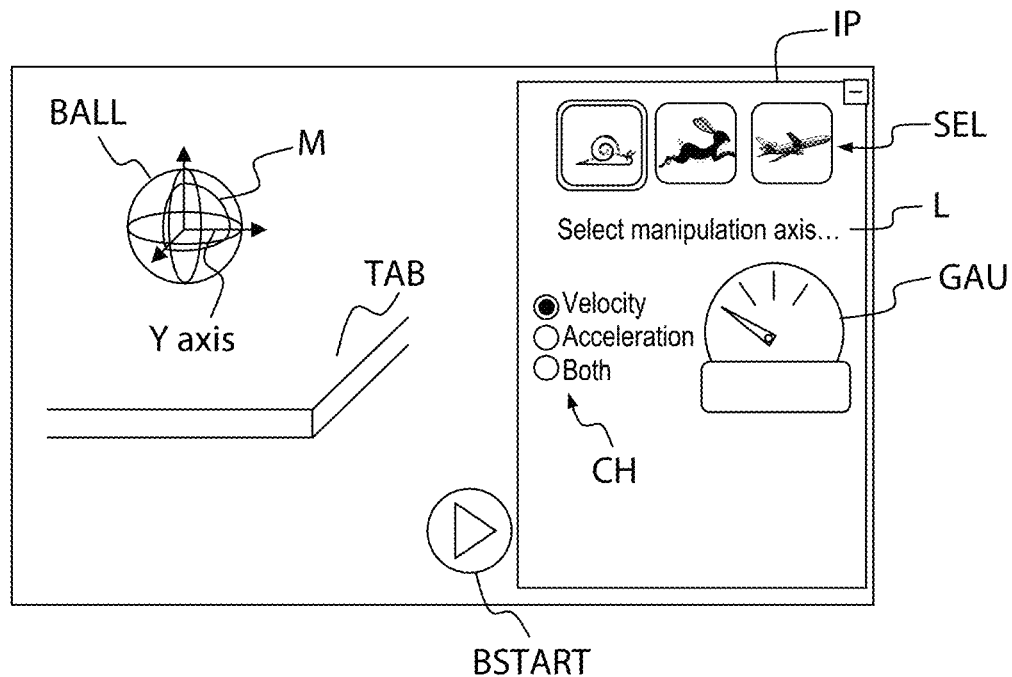

Then in a step 2, user will press button BSTART and result will be displayed like represented on FIG. 12. The system captures the user intent to define initial condition IC on the ball BALL and holds the simulation in suspended mode at time=0 second. In this mode user inputs initial condition IC.

On FIG. 12, as a result of step 2, the initial panel IP appears and is completed, and notably the selection of the manipulation axis. On a step 3, the user selects the Y axis as the axis of translation, and selects SEL the first icon (snail) corresponding to the first magnitude of values. The user chooses to apply a first initial condition IC1 as a velocity or speed of translation as indicated on the choice CH.

Figure 13:
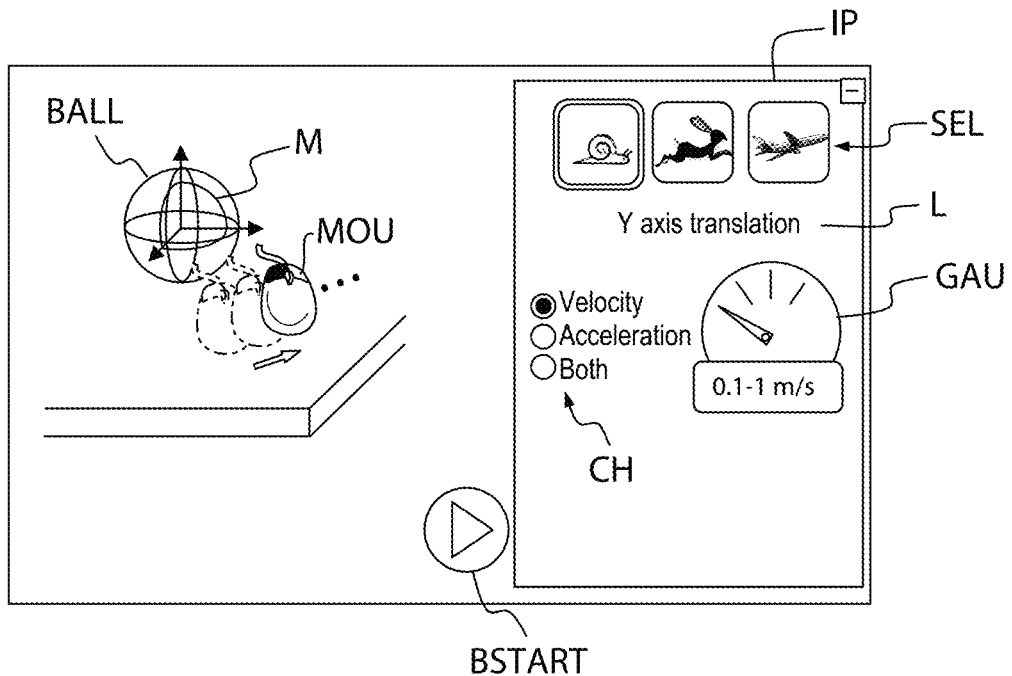

Then, in a step 4, like illustrated on FIG. 13, the user applies a speed of translation with the mouse MOU or a finger in case of touch screen.

Figure 14:
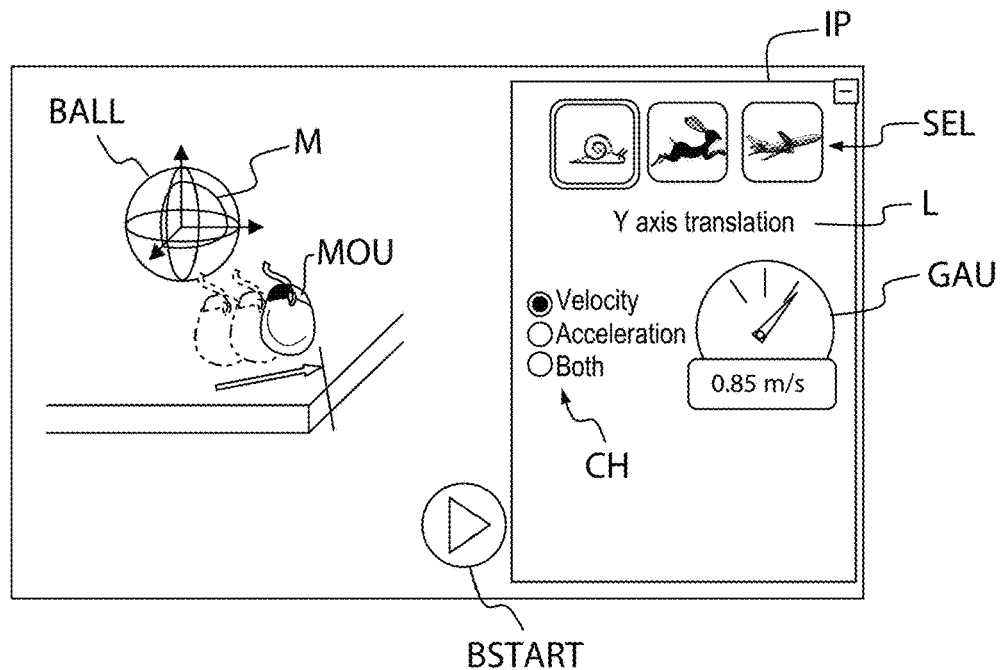

The displayed result is represented on FIG. 14, wherein the gauge GAU indicates the instantly measured value of the first initial condition IC1 in real time, in this case 0.85 m/s.

In a step 5, the user stops applying a speed of translation.

Figure 15:
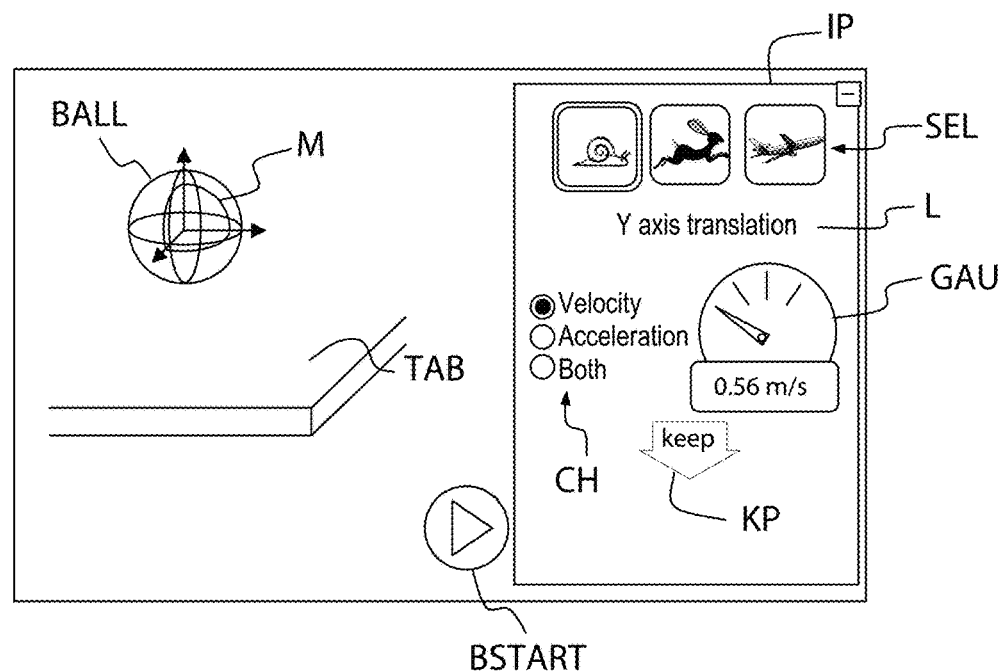

On FIG. 15, in result, the arrow of the gauge GAU indicates 0, as there is no more manipulation, and the value displayed on the back of the gauge GAU is the average value computed during the manipulation sequence, in this case 0.56 m/s. An indicator, in this case, an arrow KP comprising the word "keep", appears in back of the initial panel IP, to indicate to the user that he can keep the first initial condition IC1 he has defined.

On a step 6, the user presses the arrow KP.

Figure 16:
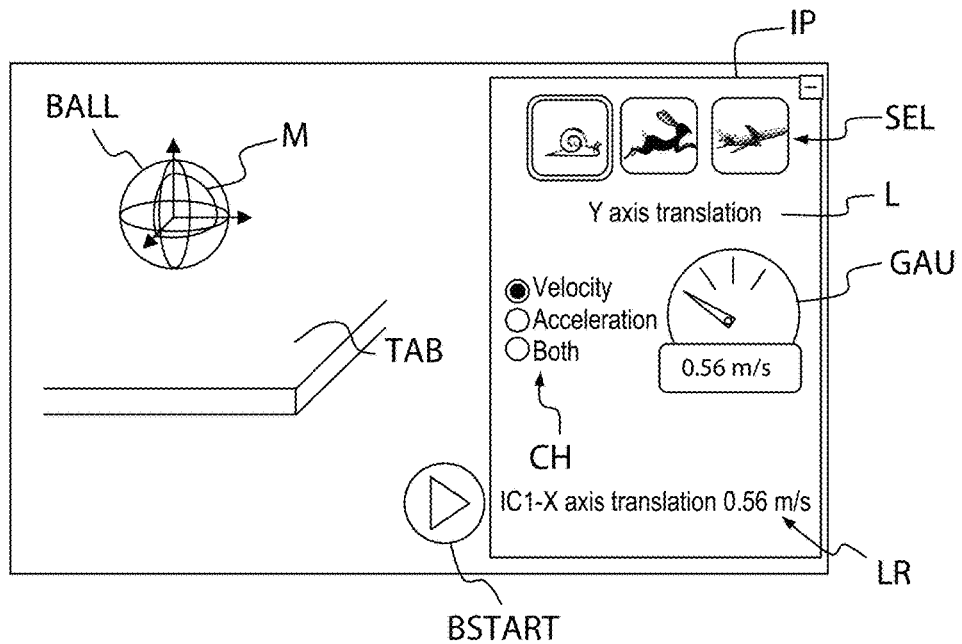
Figure 17:
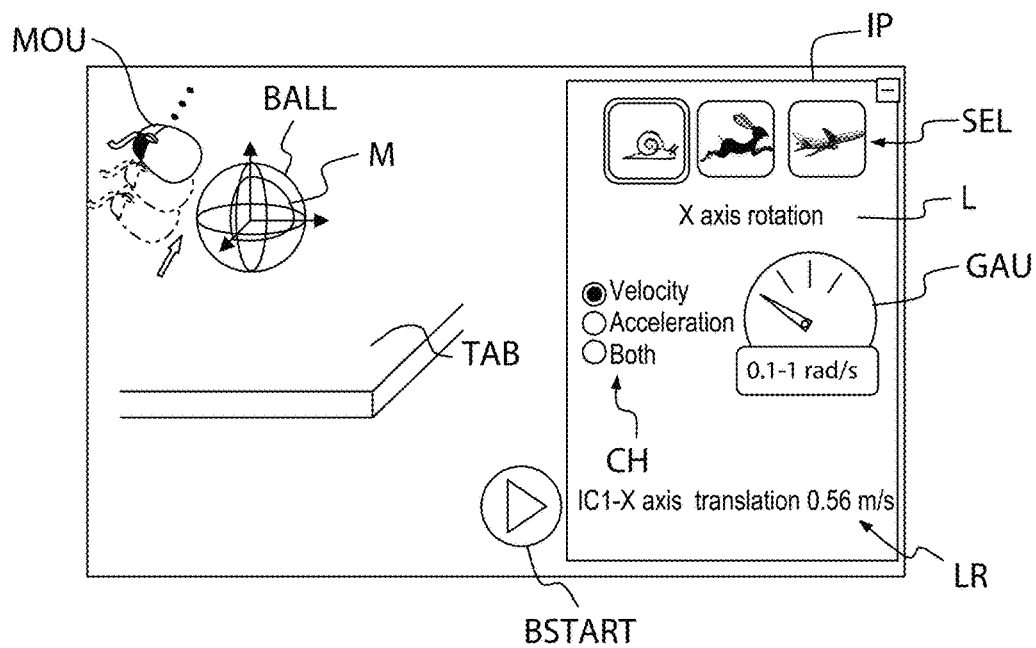

In result, on FIG. 16, a back line LR remains to remind the first initial condition IC1: on the Y axis, an initial translation speed of 0.56 m/s.

In a step 7, the user selects an arc of the manipulator M to define a second initial condition IC2 of rotation around the X axis. The system understands the user intent and shows the magnitude of possible values of 0.1 to 1 rad/s below the gauge as represented on FIG. 17.

Thus, in a step 8, the user applies a speed or rotation with the mouse MOU or a finger in case of touch screen.

Figure 18:
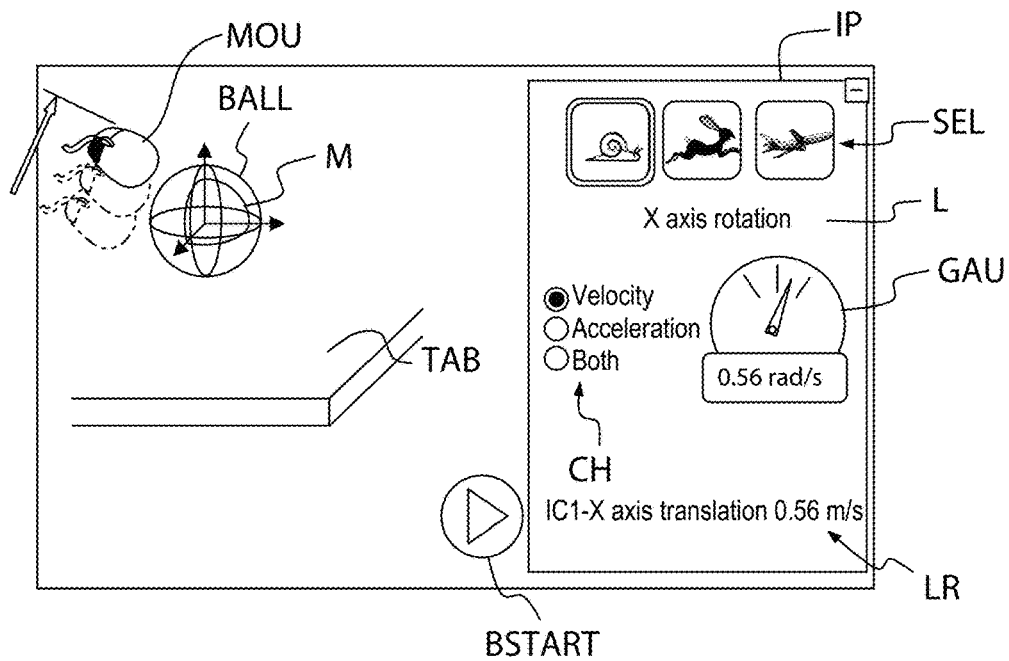

The displayed result is represented on FIG. 18, wherein the gauge GAU indicates the instantly measured value of the second initial condition IC2 in real time, in this case 0.56 rad/s.

In a step 9, the user stops applying a speed of rotation.

Figure 19:
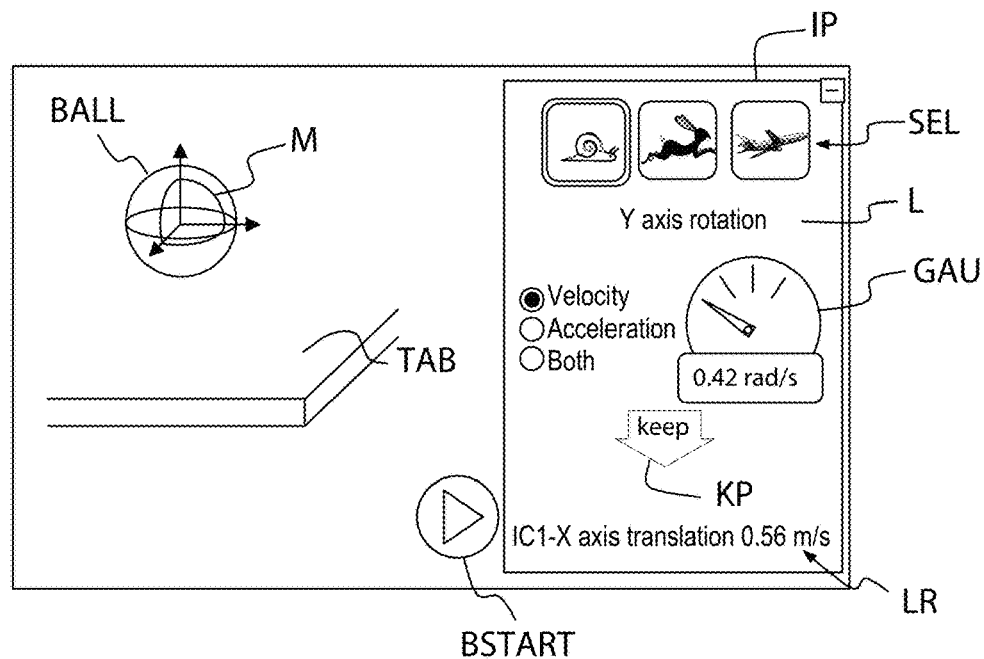

On FIG. 19, in result, the arrow of the gauge GAU indicates 0, as there is no more manipulation, and the value displayed on the back of the gauge GAU is the average value computed during the manipulation sequence, in this example 0.42 rad/s.

Thus, the user can define several initial conditions IC and keep them.

Figure 20:
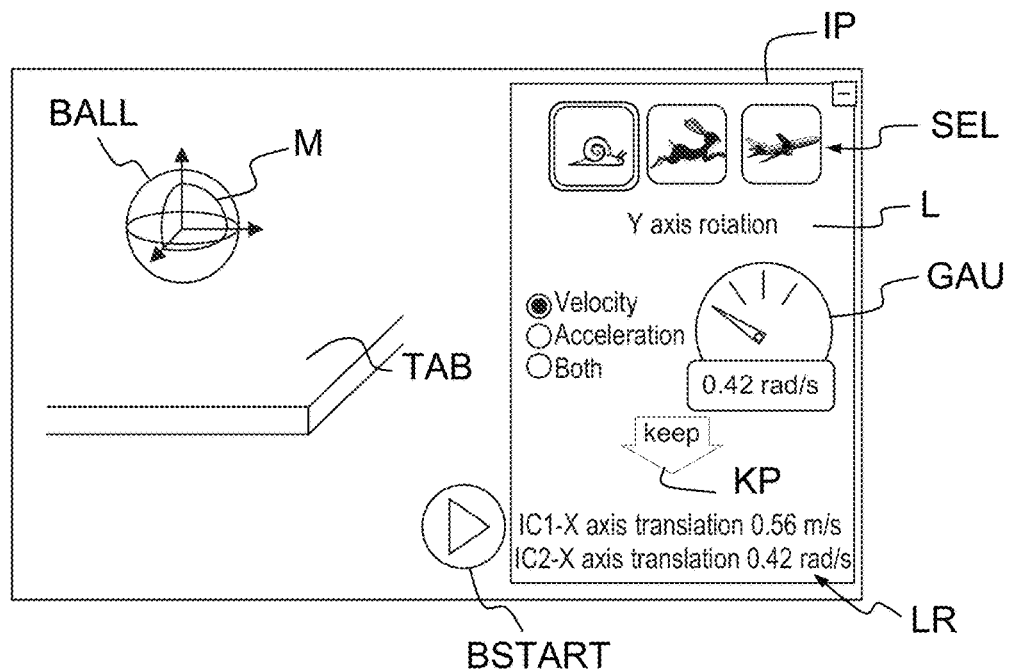

In this example, in a step 10, the user presses a keep button KP and the result, like displayed on FIG. 20, shows a second line to remind user a second initial condition IC has just been added. Pressing button KP for the last entered initial condition IC is optional.

Figure 21:
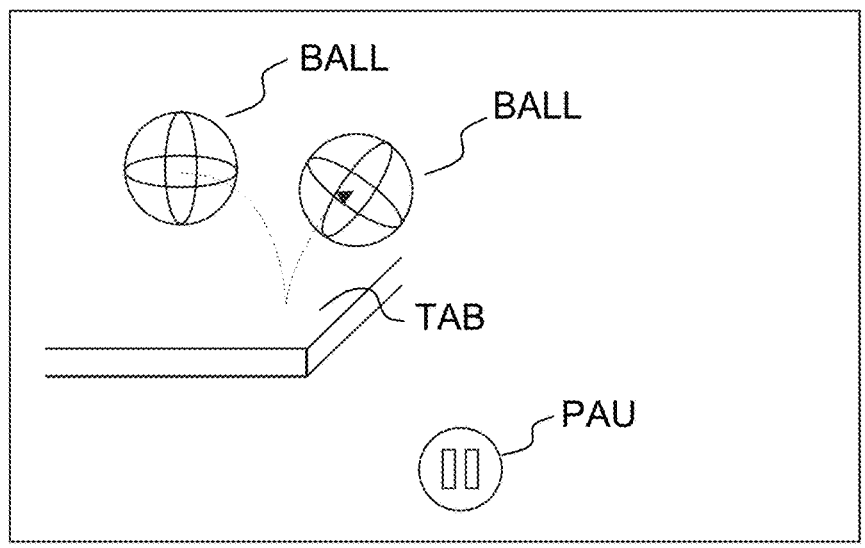

Then, in a step 11, user finally presses BSTART button and as a result, like illustrated on FIG. 21, the ball BALL bounces on the table TAB and is lifted due to both effect of initial conditions.

translation speed to launch the ball BALL to the right side direction a spinning effect due to rotation initial condition IC on the ball BALL.

Figure 22:
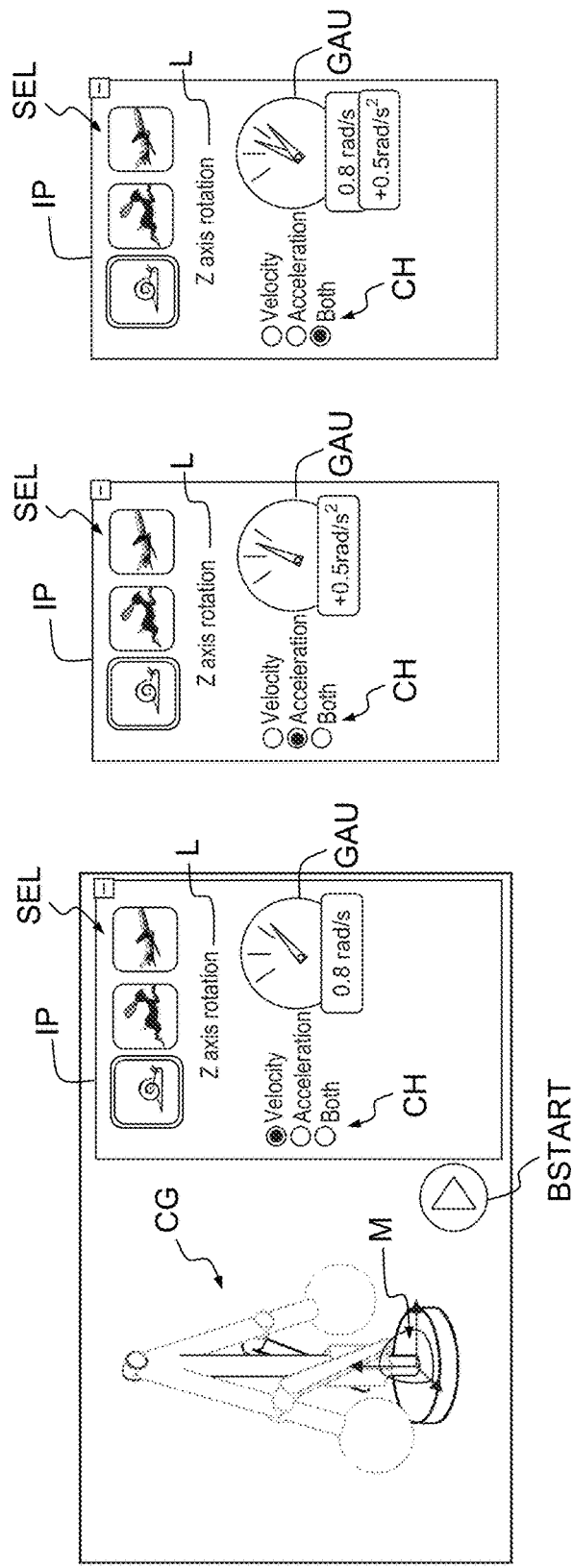
FIG. 22 illustrates an initial condition IC as a velocity, acceleration or both.

As illustrated on FIG. 22, an initial condition IC can be velocity, acceleration or both.

Furthermore, the definition of the value of an initial condition IC with the mouse MOU or a finger in case of touch screen, depends on the magnitude of values or range selected by selector SEL.

Alternatively, a value of an initial condition IC can be directly entered.

Figure 23:
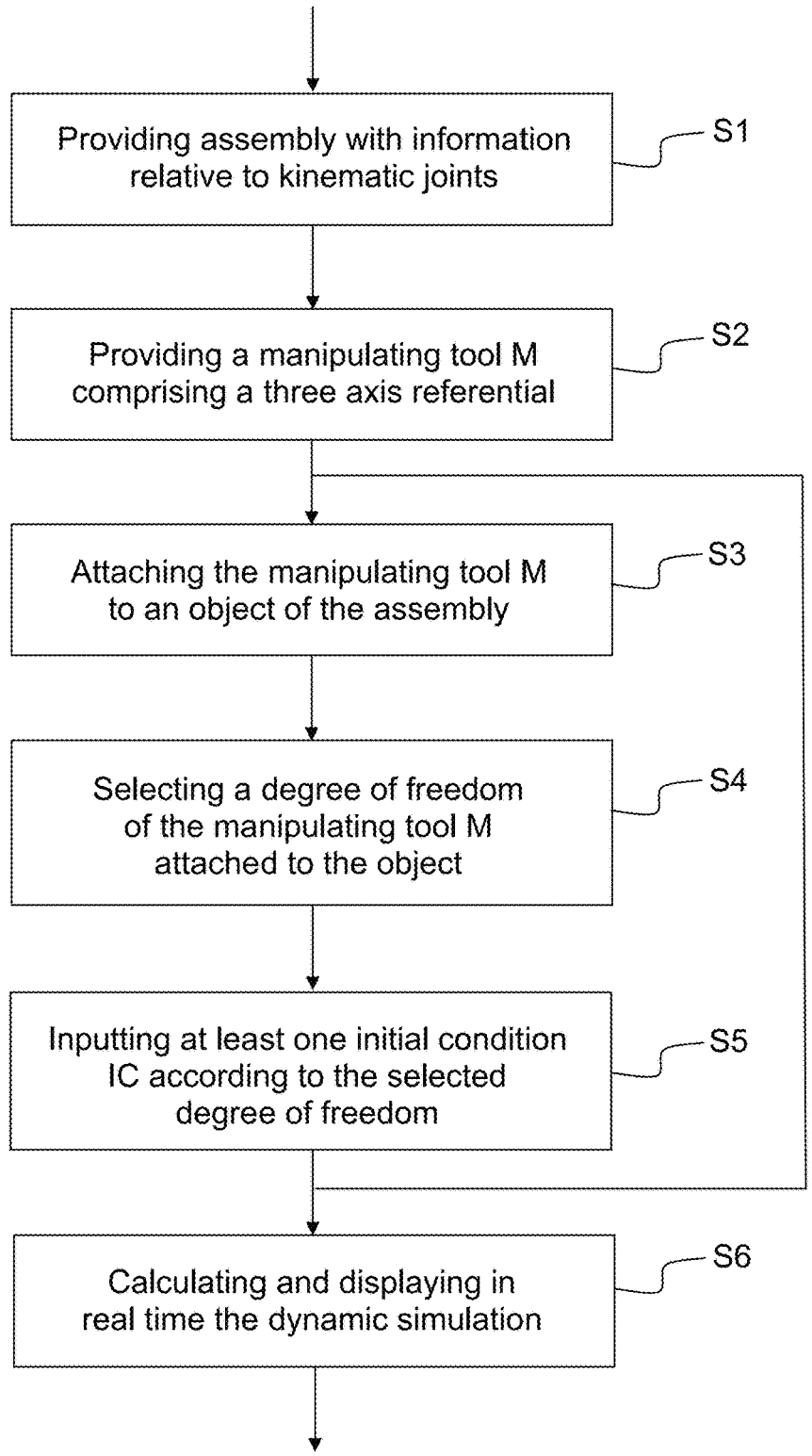
FIG. 23 illustrates a method according to an aspect of the invention.

To summarize the above, the method according to an aspect of the invention comprises the step illustrated on FIG. 23.

In a first step S1, the method provides the assembly of objects with information relative to kinematic joints linking objects of the assembly.

Then, in a second step S2, the method provides a manipulating tool M, embedded in the scene, comprising a referential with three-axis allowing for each axis a degree of freedom in translation and a degree of freedom in rotation, and in a third step S3 the method attaches said manipulating tool M to one object of the assembly.

Thus, in a fourth step S4, the method selects a degree of freedom of the manipulating tool M attached to the object of the assembly, and in a fifth step S5, the method inputs at least one initial condition IC according to said selected degree of freedom, an initial condition IC comprising an initial position and, furthermore, an initial speed and/or an initial acceleration.

Then after the step S5, the user can enter another initial condition IC and the method returns to the third step S3, or the user can start the simulation and the method, in a sixth step S6 calculates in real-time and displays in real-time the result of a dynamic simulation.

Thus the present invention provides a computer-implemented method and a system for dynamic simulation of an assembly of objects in a three-dimensional scene of a system of computer-aided design, taking into account initial conditions.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method for rendering physical behavior of a designed assembly of objects in a three-dimensional scene of a system of computer-aided design, the method comprising the steps of:
   providing the assembly of objects with information relative to kinematic joints linking objects of the assembly;
   providing a motion application tool embedded in the scene, said motion application tool being a graphical artifact presented on a graphical user interface as a representation of three-axes allowing for each axis a direction of motion in translation and a direction of motion in rotation, said motion application tool not belonging to the assembly of objects and said motion application tool being controllable by an input device of the system of computer-aided design;
   using said input device to attach said motion application tool to one object of the assembly and selecting a direction of motion using the motion application tool attached to the object of the assembly;
   using said input device or another input device of the system of computer-aided design for inputting at least one initial condition according to said selected direction of motion, the at least one initial condition including an initial speed or an initial acceleration of the object to which the motion application tool is attached, wherein inputting the at least one initial condition is executed by using said input device of the system of computer-aided design for imparting a movement to the motion application tool, the imparted movement to the motion application tool being converted to the at least one initial condition based on one or more measured values of a manipulation sequence performed by real-time user interactions with said input device or said another input device; and
   calculating and rendering on the graphical user interface in real time the physical behavior of the assembly of objects taking into account the at least one initial condition previously defined, resulting in a simulation of the assembly of objects;
   wherein the at least one initial condition is a computed average of the one or more measured values of the manipulation sequence.

2. The computer-implemented method according to claim 1, wherein the step of inputting the at least one initial condition comprises:

a first sub-step of selecting a range of values of an initial condition; and a second sub-step of determining a value of the initial condition within said range.

3. The computer-implemented method according to claim 1, wherein imparting a movement to the motion application tool is made using a mouse with a pressed button or with a contact of a finger on a screen of displaying.

4. A non-transitory computer-readable medium comprising:

computer memory storage storing computer-executable instructions causing a computer system to perform operations rendering physical behavior of a designed assembly of objects in a three-dimensional scene of a system of computer-aided design, the computer system performing operations including:

providing the assembly of objects with information relative to kinematic joints linking objects of the assembly;

providing a motion application tool embedded in the scene, said motion application tool being a graphical artifact presented on a graphical user interface as a representation of three-axes allowing for each axis a direction of motion in translation and a direction of motion in rotation, said motion application tool not belonging to the assembly of objects and said motion application tool being controllable by an input device of the system of computer-aided design;

responsive to input signals received from said input device, attaching said motion application tool to one object of the assembly and selecting a direction of motion using the motion application tool attached to the object of the assembly;

responsive to input signals received from real-time user interactions with said input device or another input device of the system of computer-aided design, inputting at least one initial condition according to said selected direction of motion, the at least one initial condition including an initial speed or an initial acceleration of the object to which the motion application tool is attached, wherein inputting the at least one initial condition is executed by using said input signals for imparting a movement to the motion application tool, the imparted movement to the motion application tool being converted to at least one initial condition based on one or more measured values of a manipulation sequence performed by the real-time user interactions with said input device or said another input device; and calculating and rendering on the graphical user interface in real time the physical behavior of the assembly of objects taking into account the at least one initial condition previously defined, resulting in a simulation of the assembly of objects;

wherein the at least one initial condition is a computed average of the one or more measured values of the manipulation sequence.

5. A computer program product comprising:

a non-transitory computer readable medium, rendering physical behavior of a designed assembly of objects in a three-dimensional scene of a system of computer-aided design; and code means stored on the non-transitory computer readable medium causing the system to take the steps of:

providing the assembly of objects with information relative to kinematic joints linking objects of the assembly, providing a motion application tool embedded in the scene, said motion application tool being a graphical artifact presented on a graphical user interface as a representation of three-axes allowing for each axis a direction of motion in translation and a direction of motion in rotation, said motion application tool not belonging to the assembly of objects and said motion application tool being controllable by an input device of the system of computer-aided design, responsive to input signals received from said input device, attaching said motion application tool to one object of the assembly and selecting a direction of motion using the motion application tool attached to the object of the assembly, responsive to input signals received from real-time user interactions with said input device or another input device of the system of computer-aided design, inputting at least one initial condition according to said selected direction of motion, the at least one initial condition including an initial speed or an initial acceleration of the object to which the motion application tool is attached, wherein inputting the at least one initial condition is executed by using said input signals for imparting a movement to the motion application tool, the imparted movement to the motion application tool being converted to the at least one initial condition based on one or more measured values of a manipulation sequence performed by the real-time user interactions with said input device or said another input device, and calculating and rendering on the graphical user interface in real time the physical behavior of the assembly of objects taking into account the at least one initial condition previously defined, resulting in a simulation of the assembly of objects;

wherein the at least one initial condition is a computed average of the one or more measured values of the manipulation sequence.

6. A computer apparatus comprising:

at least an input device, a graphical user interface, a processor rendering physical behavior of a designed assembly of objects in a three-dimensional scene of a computer-aided design system; and the computer-aided design system comprising means for implementing:

providing the assembly of objects with information relative to kinematic joints linking objects of the assembly, providing a motion application tool embedded in the scene, said motion application tool being a graphical artifact presented on the graphical user interface as a representation of three-axes allowing for each axis a direction of motion in translation and a direction of motion in rotation, said motion application tool not belonging to the assembly of objects and said motion application tool being controllable by the input device, responsive to input signals received from said input device, attaching said motion application tool to one object of the assembly and selecting a direction of motion using the motion application tool attached to the object of the assembly, responsive to input signals received from real-time user interactions with the input device or another input device of the system of computer-aided design, inputting at least one initial condition according to said selected direction of motion, the at least one initial condition consisting of an initial speed or an initial acceleration of the object to which the manipulating tool is attached, wherein inputting the at least one initial condition is executed by using said input signals for imparting a movement to the motion application tool, the imparted movement to the motion application tool being converted to the at least one initial condition based on one or more measured values of a manipulation sequence performed by the real-time user interactions with said input device or said another input device, and calculating and rendering on the graphical user interface in real time the physical behavior of the assembly of objects taking into account the at least one initial condition previously defined, resulting in a simulation of the assembly of objects;

wherein the at least one initial condition is a computed average of the one or more measured values of the manipulation sequence.

7. The computer apparatus as claimed in claim 6 wherein the computer-aided design system means for inputting the at least one initial condition comprises:
   a first sub-step of selecting a range of values of an initial condition; and
   a second sub-step of determining a value of the initial condition within said range.

8. The computer apparatus as claimed in claim 6 wherein the computer-aided design system means imparts the movement to the motion application tool in response to real-time user interactions with a mouse with a pressed button or contact of a finger on a display screen.

9. A computer-implemented method for rendering physical behavior of a designed assembly of objects in a three-dimensional scene of a system of computer-aided design, the method comprising the steps of:
   providing the assembly of objects with information relative to kinematic joints linking objects of the assembly;
   providing a motion application tool embedded in the scene, said motion application tool being a graphical artifact presented on a graphical user interface as a representation of three-axes allowing for each axis a direction of motion in translation and a direction of motion in rotation, said motion application tool not belonging to the assembly of objects and said motion application tool being controllable by an input device of the system of computer-aided design;
   using said input device to attach said motion application tool to one object of the assembly and selecting a direction of motion using the motion application tool attached to the object of the assembly;
   using said input device or another input device of the system of computer-aided design for inputting at least one initial condition according to said selected direction of motion, the at least one initial condition including an initial speed or an initial acceleration of the object to which the motion application tool is attached, wherein inputting the at least one initial condition is executed by using said input device of the system of computer-aided design for imparting a movement to the motion application tool, the imparted movement to the motion application tool being converted to the at least one initial condition based on one or more measured values of a manipulation sequence performed by real-time user interactions with said input device or said another input device; and
   calculating and rendering on the graphical user interface in real time the physical behavior of the assembly of objects taking into account the at least one initial condition previously defined, resulting in a simulation of the assembly of objects;
   wherein the one or more measured values of the manipulation sequence are determined based on a speed of movement performed with said input device or said another input device during the manipulation sequence.

10. The computer-implemented method according to claim 9, wherein the step of inputting the at least one initial condition comprises:
    a first sub-step of selecting a range of values of an initial condition; and
    a second sub-step of determining a value of the initial condition within said range.

11. The computer-implemented method according to claim 9, wherein imparting a movement to the motion application tool is made using a mouse with a pressed button or with a contact of a finger on a screen of displaying.

12. A non-transitory computer-readable medium comprising:
    computer memory storage storing computer-executable instructions causing a computer system to perform operations rendering physical behavior of a designed assembly of objects in a three-dimensional scene of a system of computer-aided design, the computer system performing operations including:
    providing the assembly of objects with information relative to kinematic joints linking objects of the assembly;
    providing a motion application tool embedded in the scene, said motion application tool being a graphical artifact presented on a graphical user interface as a representation of three-axes allowing for each axis a direction of motion in translation and a direction of motion in rotation, said motion application tool not belonging to the assembly of objects and said motion application tool being controllable by an input device of the system of computer-aided design;
    responsive to input signals received from said input device, attaching said motion application tool to one object of the assembly and selecting a direction of motion using the motion application tool attached to the object of the assembly;
    responsive to input signals received from real-time user interactions with said input device or another input device of the system of computer-aided design, inputting at least one initial condition according to said selected direction of motion, the at least one initial condition including an initial speed or an initial acceleration of the object to which the motion application tool is attached, wherein inputting the at least one initial condition is executed by using said input signals for imparting a movement to the motion application tool, the imparted movement to the motion application tool being converted to the at least one initial condition based on one or more measured values of a manipulation sequence performed by the real-time user interactions with said input device or said another input device; and
    calculating and rendering on the graphical user interface in real time the physical behavior of the assembly of objects taking into account the at least one initial condition previously defined, resulting in a simulation of the assembly of objects;
    wherein the one or more measured values of the manipulation sequence are determined based on a speed of movement performed with said input device or said another input device during the manipulation sequence.

13. A computer program product comprising:
a non-transitory computer readable medium, rendering physical behavior of a designed assembly of objects in a three-dimensional scene of a system of computer-aided design; and
code means stored on the non-transitory computer readable medium causing the system to take the steps of:
   providing the assembly of objects with information relative to kinematic joints linking objects of the assembly,
   providing a motion application tool embedded in the scene, said motion application tool being a graphical artifact presented on a graphical user interface as a representation of three-axes allowing for each axis a direction of motion in translation and a direction of motion in rotation, said motion application tool not belonging to the assembly of objects and said motion application tool being controllable by an input device of the system of computer-aided design,
   responsive to input signals received from said input device, attaching said motion application tool to one object of the assembly and selecting a direction of motion using the motion application tool attached to the object of the assembly,
   responsive to input signals received from real-time user interactions with said input device or another input device of the system of computer-aided design, inputting at least one initial condition according to said selected direction of motion, the at least one initial condition including an initial speed or an initial acceleration of the object to which the motion application tool is attached, wherein inputting the at least one initial condition is executed by using said input signals for imparting a movement to the motion application tool, the imparted movement to the motion application tool being converted to the at least one initial condition based on one or more measured values of a manipulation sequence performed by the real-time user interactions with said input device or said another input device, and
   calculating and rendering on the graphical user interface in real time the physical behavior of the assembly of objects taking into account the at least one initial condition previously defined, resulting in a simulation of the assembly of objects;
wherein the one or more measured values of the manipulation sequence are determined based on a speed of movement performed with said input device or said another input device during the manipulation sequence.

14. A computer apparatus comprising:
at least an input device, a graphical user interface, a processor rendering physical behavior of a designed assembly of objects in a three-dimensional scene of a computer-aided design system; and
the computer-aided design system comprising means for implementing:
   providing the assembly of objects with information relative to kinematic joints linking objects of the assembly,
   providing a motion application tool embedded in the scene, said motion application tool being a graphical artifact presented on the graphical user interface as a representation of three-axes allowing for each axis a direction of motion in translation and a direction of motion in rotation, said motion application tool not belonging to the assembly of objects and said motion application tool being controllable by the input device,
   responsive to input signals received from said input device, attaching said motion application tool to one object of the assembly and selecting a direction of motion using the motion application tool attached to the object of the assembly,
   responsive to input signals received from real-time user interactions with the input device or another input device of the system of computer-aided design, inputting at least one initial condition according to said selected direction of motion, the at least one initial condition consisting of an initial speed or an initial acceleration of the object to which the manipulating tool is attached, wherein inputting the at least one initial condition is executed by using said input signals for imparting a movement to the motion application tool, the imparted movement to the motion application tool being converted to the at least one initial condition based on one or more measured values of a manipulation sequence performed by the real-time user interactions with said input device or said another input device, and
   calculating and rendering on the graphical user interface in real time the physical behavior of the assembly of objects taking into account the at least one initial condition previously defined, resulting in a simulation of the assembly of objects;
wherein the one or more measured values of the manipulation sequence are determined based on a speed of movement performed with said input device or said another input device during the manipulation sequence.

15. The computer apparatus as claimed in claim 14 wherein the computer-aided design system means for inputting the at least one initial condition comprises:
   a first sub-step of selecting a range of values of an initial condition; and
   a second sub-step of determining a value of the initial condition within said range.

16. The computer apparatus as claimed in claim 14 wherein the computer-aided design system means imparts the movement to the motion application tool in response to real-time user interactions with a mouse with a pressed button or contact of a finger on a display screen.

* * * * *